United States Patent
Schillinger et al.

(10) Patent No.: US 9,615,469 B2
(45) Date of Patent: Apr. 4, 2017

(54) ELECTRONIC DEVICE AND METHOD FOR PRODUCING AN ELECTRONIC DEVICE

(71) Applicant: CONTINENTAL TEVES AG & CO. OHG, Frankfurt (DE)

(72) Inventors: Jakob Schillinger, Gaimersheim (DE); Günther Romhart, Süssen (DE); Yann Dinard, Frankfurt am Main (DE)

(73) Assignee: Continental Teves AG & Co. oHG, Frankfurt (DE)

( * ) Notice: Subject to any disclaimer, the term of this patent is extended or adjusted under 35 U.S.C. 154(b) by 0 days.

(21) Appl. No.: 14/651,307

(22) PCT Filed: Nov. 29, 2013

(86) PCT No.: PCT/EP2013/075187
§ 371 (c)(1),
(2) Date: Jun. 11, 2015

(87) PCT Pub. No.: WO2014/095315
PCT Pub. Date: Jun. 26, 2014

(65) Prior Publication Data
US 2015/0327376 A1    Nov. 12, 2015

(30) Foreign Application Priority Data

Dec. 20, 2012  (DE) .................. 10 2012 224 102
Sep. 6, 2013  (DE) .................. 10 2013 217 888

(51) Int. Cl.
*H01L 21/56*  (2006.01)
*H01L 23/28*  (2006.01)
(Continued)

(52) U.S. Cl.
CPC ......... *H05K 5/0034* (2013.01); *G01D 11/245* (2013.01); *G01D 18/00* (2013.01);
(Continued)

(58) Field of Classification Search
CPC .................. H01L 2223/54433; H01L 23/544
(Continued)

(56) References Cited

U.S. PATENT DOCUMENTS

| 5,311,757 A | 5/1994 | Spahn |
| 5,656,782 A | 8/1997 | Powell, II |

(Continued)

FOREIGN PATENT DOCUMENTS

| CN | 1508516 | 6/2004 |
| CN | 101089879 | 12/2007 |

(Continued)

OTHER PUBLICATIONS

German Search Report for German Application No. 10 2013 217 888.3 mailed Sep. 1, 2014, including partial translation.
(Continued)

*Primary Examiner* — Hung V Ngo
(74) *Attorney, Agent, or Firm* — RatnerPrestia

(57) ABSTRACT

An electronic device including: an electronic unit accommodated in a circuit housing and a molded body which surrounds the circuit housing. The molding compound has a cut-out that exposes the circuit housing, in which cut-out an identification that characterizes the electronic circuit is arranged.

2 Claims, 3 Drawing Sheets

(51) Int. Cl.
  *H05K 5/00* (2006.01)
  *G01R 1/04* (2006.01)
  *G01R 33/09* (2006.01)
  *G01D 11/24* (2006.01)
  *G01D 18/00* (2006.01)
  *H05K 3/28* (2006.01)
  *H01L 23/544* (2006.01)
  *H05K 1/02* (2006.01)
  *H05K 5/06* (2006.01)

(52) U.S. Cl.
  CPC .............. *G01R 1/04* (2013.01); *G01R 33/09* (2013.01); *H01L 23/544* (2013.01); *H05K 1/0266* (2013.01); *H05K 3/284* (2013.01); *H05K 5/003* (2013.01); *H05K 5/0017* (2013.01); *H05K 5/062* (2013.01); *H01L 2223/54433* (2013.01); *H01L 2223/54486* (2013.01); *H01L 2224/48091* (2013.01); *H01L 2224/48137* (2013.01); *H01L 2924/1461* (2013.01); *Y10T 29/49004* (2015.01); *Y10T 29/49147* (2015.01)

(58) Field of Classification Search
  USPC ........................................................ 174/521
  See application file for complete search history.

(56) References Cited

U.S. PATENT DOCUMENTS

| | | | |
|---|---|---|---|
| 5,927,484 | A | 7/1999 | Malingowski |
| 6,003,369 | A | 12/1999 | Tola |
| 6,178,359 | B1 | 1/2001 | Dobyns |
| 6,963,787 | B2 | 11/2005 | Takada |
| 7,028,568 | B2 | 4/2006 | Tokunaga |
| 7,633,395 | B2 | 12/2009 | Kanno |
| 8,770,988 | B2 | 7/2014 | Furukawa |
| 8,820,160 | B2 | 9/2014 | Doering |
| 9,014,921 | B2 | 4/2015 | Bretzigheimer |
| 2002/0170897 | A1 | 11/2002 | Hall |
| 2004/0118227 | A1 | 6/2004 | Tokunaga |
| 2005/0179549 | A1* | 8/2005 | Ota ............... H01L 23/544 340/572.1 |
| 2007/0296062 | A1 | 12/2007 | Chan |
| 2008/0050862 | A1* | 2/2008 | Yano ............... H01L 23/49575 438/127 |

FOREIGN PATENT DOCUMENTS

| | | |
|---|---|---|
| DE | 3243132 | 5/1984 |
| DE | 3506639 | 8/1986 |
| DE | 9202995 | 6/1992 |
| DE | 19709364 | 12/1998 |
| DE | 69616314 | 7/2002 |
| DE | 102004054622 | 5/2006 |
| DE | 202004020518 | 5/2006 |
| DE | 69833145 | 10/2006 |
| DE | 102006042556 | 3/2008 |
| DE | 102011080789 | 2/2012 |
| JP | 04268789 | 9/1992 |
| JP | 11330715 | 11/1999 |
| JP | 2003044119 | 2/2003 |
| JP | 2004198240 | 7/2004 |
| JP | 2011086685 | 4/2011 |
| JP | 2011100718 | 5/2011 |
| WO | 2007005864 | 1/2007 |
| WO | 2010037810 | 4/2010 |

OTHER PUBLICATIONS

International Search Report for International Application No. PCT/EP2013/075187 mailed May 9, 2014.

Japanese Office Action dated Jun. 22, 2016 for Japanese Application No. 2015-548321, including English translation, 6 pages.

* cited by examiner

ELECTRONIC DEVICE AND METHOD FOR PRODUCING AN ELECTRONIC DEVICE

CROSS REFERENCE TO RELATED APPLICATIONS

This application is the U.S. National Phase Application of PCT/EP2013/075187, filed Nov. 29, 2013, which claims priority to German Patent Application Nos. 10 2012 224 102.7, filed Dec. 20, 2012 and 10 2013 213 217 888.3, filed Sep. 6, 2013, the contents of such applications being incorporated by reference herein.

FIELD OF THE INVENTION

The invention relates to an electronic device and a method for manufacturing an electronic device.

BACKGROUND OF THE INVENTION

An electronic device in the form of a sensor for the output of an electrical signal based on a detected physical magnitude is known from WO2010/037 810 A1, which is incorporated by reference. The electronic device comprises an electronic circuit that is housed in a circuit housing.

SUMMARY OF THE INVENTION

An aspect of the invention improves the known electronic device.

According to one aspect of the invention, an electronic device comprises an electronic circuit, housed in a circuit housing, and a molded body surrounding the circuit housing, wherein the molding compound has a cutout that exposes the circuit housing in which a feature that identifies the electronic circuit is arranged on the circuit housing.

The electronic device indicated is based on the consideration that the electronic circuit used must on the one hand be protected from mechanical and electrical damage, but on the other hand must be adapted to its end application. Whereas the mechanical and electrical protection in the form of the circuit housing can be manufactured using mass production together with the electronic circuit itself, the shape of the molding compound depends on the end application, and must be manufactured in an individualized manner for this.

It can be advantageous, in part for the purposes of analyzing faults in the electronic device, to be able to trace back fully the manufacturing history of the electronic device. For this purpose a feature that identifies the electronic circuit can be applied to the circuit housing, from which, for example, the populating and/or bonding process and/or the molding process used for manufacture of the circuit housing surrounding the electronic circuit can be deduced. Measurements obtained during the calibration and testing of the electronic circuit can, moreover, be assigned to this applied feature. If, after application of the feature that identifies the electronic circuit on the circuit housing, the circuit housing is surrounded by the molding compound in the manner described above, the feature that identifies the electronic circuit will be covered by the molding compound, and at least can no longer be seen. The molding compound around the circuit housing must therefore be destroyed to reconstruct the manufacturing history, wherein however the feature that identifies the electronic circuit could also be damaged if not even entirely destroyed. In addition, this can also entail a considerable effort if it is necessary to search for the electronic devices of an identical manufacturing series out of a large number of electronic devices. It would here be necessary first to remove the molding compounds from all the electronic devices present, so that the feature that identifies the electronic circuit can be exposed and the production history determined.

In the context of the electronic device indicated it is for this reason proposed that a cutout in the form of a window is created in the molding compound around the circuit housing through which the feature that identifies the electronic circuit can be seen. In this way the electronic devices of an identical manufacturing series can quickly and easily be sorted out without the need first laboriously to remove the molding compound, in the course of which the feature that identifies the electronic circuit may even be destroyed.

In a development of the electronic device indicated, the feature that identifies the electronic circuit is a serial number of the electronic circuit. Serial numbers of this type identify the electronic circuit uniquely, and can also be managed by computer, for example in a computer database.

In a special development of the electronic device, the feature that identifies the electronic circuit is an electronically readable feature that is read out in a simple manner by an electronic reading device and compared with the computer database.

In a preferred development of the electronic device indicated, the electronically readable feature is a barcode, in particular a sequential data matrix code, known as DMC, and/or a combination of numbers and letters. Electronically readable features of this sort can be registered with standard reading devices, and can thus be read out in a simple and uncomplicated manner from the electronic device.

In a particularly preferred development of the electronic device indicated, a surrounding border is placed around the electronically readable feature in the cutout. This surrounding border makes it possible for the reading device to position itself at the electronically readable feature in order to register the information therefrom.

In another development, the electronic device indicated comprises a circuit interface connected to the electronic circuit for electrical connection to a cable interface of a data line. The electronic device can exchange data through this electronic circuit interface with other electronic units such as, for example, a control device.

In an additional development, the circuit interface in the electronic device indicated comprises a feature that identifies the circuit interface. This feature could, for example, identify the type of cable that can be connected to the circuit interface.

In a special development of the electronic device indicated, the feature that identifies the circuit interface depends on a feature that identifies the cable interface on the cable interface. In this way it is for example possible, prior to connecting the cable interface to the circuit interface, to determine by computer whether these two interfaces fit together. For this purpose, the two interfaces can be constructed in accordance with the dependent claims that describe the developments of the feature that identifies the electronic circuit.

In a preferred development of the electronic device indicated, the circuit interface is partly enclosed by the molding compound in such a way that the further feature that identifies the electronic circuit remains exposed, so that when a cable is connected it can be seen directly whether the cable interface and the circuit interface belong together or not.

In yet another development of the electronic device indicated, the surface of the circuit housing is activated at the fixing points. An activation of the surface of the circuit housing is to be understood below to refer to a partial destruction of the molecular structure of the surface of the circuit housing, so that free radicals are created at the surface of the circuit housing. These free radicals are able to form chemical and/or physical bonds with the molding compound, so that they can no longer be separated from the surface of the circuit housing. In this way the molding compound is firmly fastened to the circuit housing.

The molding compound can here comprise a polar material such as polyamide. The polar polyamide can be bonded physically to the activated surface of the circuit housing in a manner known to the expert, and thus fixed firmly to the circuit housing. Further compounds that exhibit a polar surface when the molding compound is in a melted state, and thus form a bond with the activated surface of the circuit housing, are possible. The bond that has formed remains after the molten molding compound has solidified.

In a further development of the device indicated, at least a part of the surface of the circuit housing is roughened in the area where it contacts the molding compound, so that the effective activated surface is enlarged, and the adhesive effect between the circuit housing and the molding compound is strengthened.

In a special development of the electronic device indicated, the roughened part of the surface of the circuit housing is roughened with a laser. Not only can the surface of the circuit housing be activated with the laser, but any mold-separating agent that might be present, and which might suppress the adhesion between the circuit housing and the molding compound, can be removed from the surface of the circuit housing by the laser. The laser can, moreover, at the same time also be used to create the feature that identifies the electronic circuit and/or the interfaces.

The laser can, however, alternatively also only be used to roughen the surface. The activation can then be carried out using, for example, a plasma.

In an alternative development, the electronic device indicated is configured as a sensor whose circuit is to output an electrical signal based on a registered physical magnitude. In order to register the physical magnitude, the electronic circuit can comprise a measuring transducer. The physical magnitude can here, for example, be the position in space of an object to which the sensor is fastened, a mechanical tension or any other physical magnitude.

According to a further aspect, the invention comprises a method for the manufacture of an electronic device, comprising:
 housing an electronic circuit in a circuit housing,
 arranging a feature that identifies the electronic circuit on the circuit housing,
 housing the circuit housing with the feature with a molding compound in such a way that a cutout that exposes the feature remains in the molding compound.

The method indicated can be extended by features that correspond analogously to the features of the device indicated above.

BRIEF DESCRIPTION OF THE DRAWINGS

The properties, features and advantages of this invention described above, together with the manner in which these are achieved, will be clearer and more understandable in association with the following description of the exemplary embodiments, which are explained in more detail in connection with the drawings, wherein.

DETAILED DESCRIPTION OF THE INVENTION

The same technical elements are given the same reference signs in the figures, and are only described once.

Figure 1:
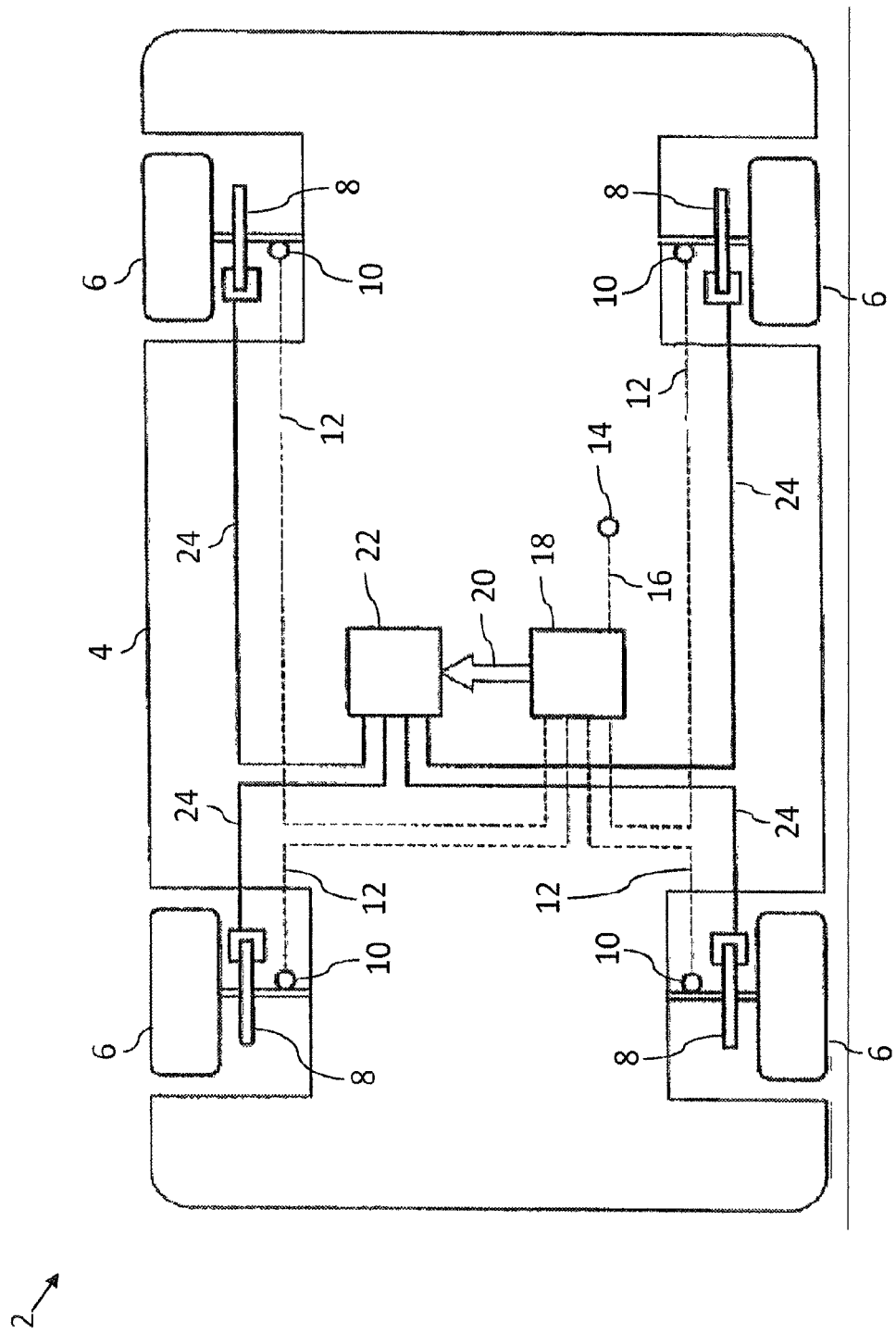
FIG. 1 shows a schematic view of a vehicle with vehicle dynamics control.

Reference is made to FIG. 1 which shows a schematic view of a vehicle 2 with a vehicle dynamics control of a known type. Details of this vehicle dynamics control may be taken, for example, from DE 10 2011 080 789 A1, which is incorporated by reference.

The vehicle 2 comprises a chassis 4 and four wheels 6. Each wheel 6 can be slowed with respect to the chassis 4 by a brake 8 fastened in a fixed position on the chassis 4, in order to slow a movement of the vehicle 2 on a road which is not further illustrated.

In a manner known to the expert, it is here possible for the wheels 6 of the vehicle 2 to lose their ground adhesion, and for the vehicle 2 even to deviate, through under-steering or over-steering, from a trajectory specified, for example, by a steering wheel, not further shown. This is hindered by a control loop, of a known type, such as ABS (anti-lock braking system) or ESP (electronic stability program).

In the present embodiment, the vehicle 2 comprises for this purpose speed sensors 10 on the wheels 6 which register a rotation speed 12 of the wheels 6. The vehicle 2 furthermore comprises an inertial sensor 14 which registers vehicle dynamics data 16 of the vehicle 2, from which it can output, for example, a pitch rate, a roll rate, a yaw rate, a transverse acceleration, a longitudinal acceleration and/or a vertical acceleration in a manner that is known to the expert.

On the basis of the rotation speeds 12 and vehicle dynamics data 16 that are registered, a controller 18 can determine, in a manner known to the expert, whether the vehicle 2 is slipping on the road, or is even deviating from the specified trajectory mentioned above, and can react to it accordingly with a controller output signal 20 of a known type. The controller output signal 20 can then be used by an actuating apparatus 22 in order, by means of actuating signals 24, to operate actuators, such as the brakes 8, to react in a manner known per se to the slipping and deviation from the specified trajectory.

The controller 18 can, for example, be integrated into an engine controller, of a type known per se, of the vehicle 2. The controller 18 and the actuating apparatus 22 can also be constructed as a common regulating apparatus and can optionally be integrated into the engine controller mentioned above.

In FIG. 1 the inertial sensor 14 is illustrated as an external apparatus outside the controller 18. In such a case this is referred to as an inertial sensor 14 implemented as a satellite. The inertial sensor 14 can, however, also be constructed as an SMD component, so that it can, for example, also be integrated into a housing of the controller 18.

Figure 2:
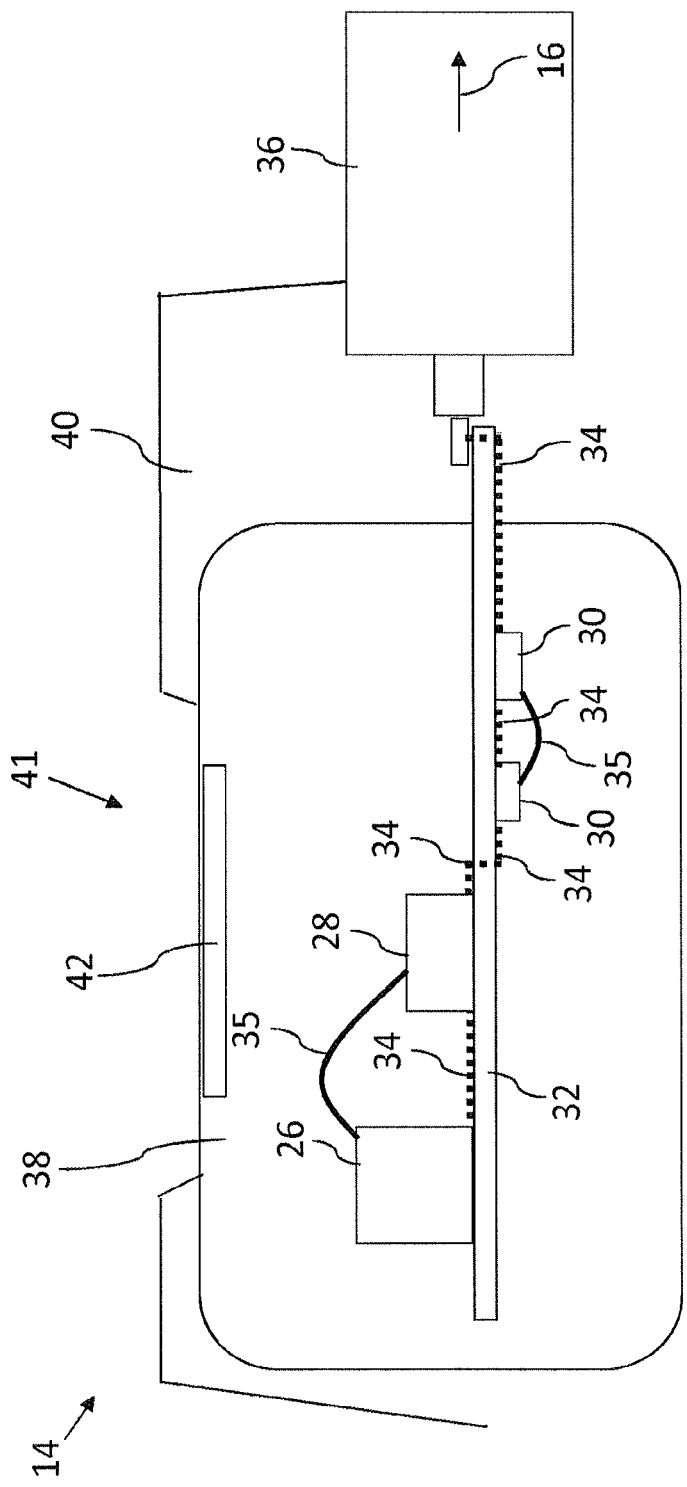
FIG. 2 shows a schematic view of an inertial sensor from FIG. 1.

Reference is made to FIG. 2, which shows a schematic view of the inertial sensor 14.

The inertial sensor 14 comprises an electronic circuit with at least one micro-electro-mechanical system 26, named MEMS 26, as a measuring transducer which, in a manner known per se, outputs a signal, not further illustrated, depending on the vehicle dynamics data 16 via an amplifier circuit 28 to two signal evaluation circuits 30 in the form of an application-specific integrated circuit 30, named ASIC 30. The ASIC 30 can then generate the vehicle dynamics data 16 on the basis of the received signal that depends on the vehicle dynamics data 16.

The MEMS 26, the amplifier circuit 28 and the ASIC 30 are carried on a circuit board 32 and are contacted electrically with a variety of conductive tracks 34 formed on the circuit board 32 and bond wires 35. Alternatively, the circuit board 32 can also be constructed as a lead frame. A circuit interface 36 can be present for output of the vehicle dynamics data 16 that is generated.

The MEMS 26 and the ASIC 30 can further be cast in a circuit housing 38 which can, for example, be made of thermosetting plastic. The circuit housing 38 could thus alone already serve as the housing of the inertial sensor 14 and protect the circuit components enclosed within it.

The inertial sensor 14 is not, however, limited to use in the vehicle dynamics control described above, and is thus manufactured for a large number of different end applications. To adapt the inertial sensor 14 to the vehicle dynamics control, it is overmolded with a molding compound 40, also known as the overmold 40. A cutout 41 is left here in the molding compound 40 in order, for example, to expose a serial number label 42, yet to be described. The molding compound 14 can, for example, be a thermosetting plastic.

The serial number label 42, visible through the cutout 41, is formed in the present embodiment as an opto-electronically readable, two-dimensional barcode. The serial number label 42 represents, in the present embodiment, a feature that identifies the electronic circuit of the inertial sensor 14 with the MEMS 26 and the ASIC 30. Generally speaking, any desired coding can be used for the two-dimensional barcode, such as for example stacked codes, matrix codes, dot codes or composite codes.

A data matrix code, known as a DMC, is particularly preferably used in the present embodiment. In the DMC, the information is encoded very compactly in a square or rectangular area as a pattern of dots. When reading a DMC, the arrangement of the dots, which have equal size within the edging (search pattern) and are on the raster of the matrix, is determined. The dots are black or white boxes lying adjacent to one another, or round dots with spaces between them. This consistent symbol size and the fixed distance between symbols alone make reading the image and decoding the information significantly more reliable, and the size of the code notably more compact. In addition, the DMC offers a method of error correction.

Figure 3:
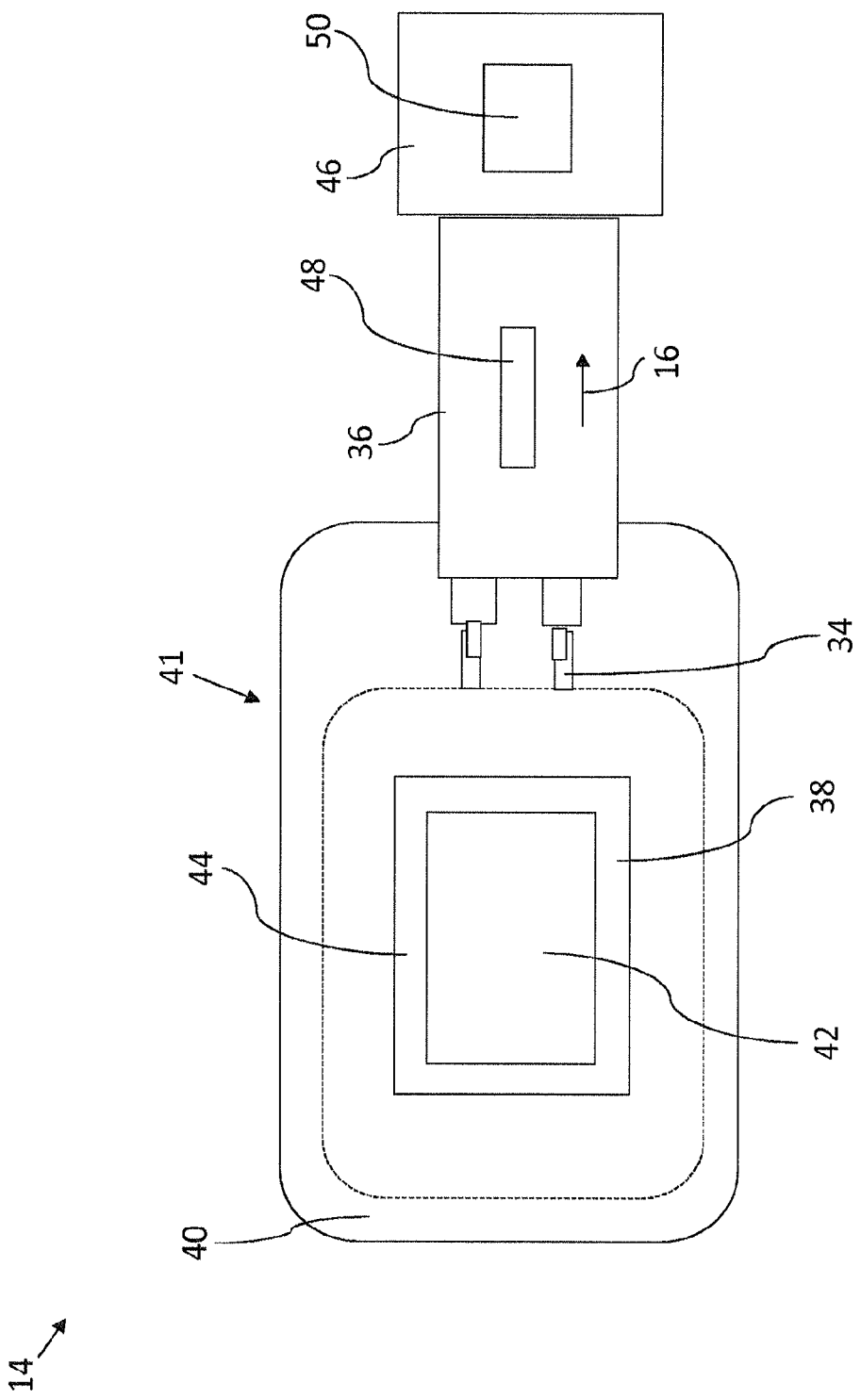
FIG. 3 shows a further schematic view of the inertial sensor of FIG. 1 to which a cable is connected.

In the present embodiment, surrounding the serial number label 42 is to be read out with a reading device, not illustrated further; with reference to FIG. 3, a surrounding border 44 is placed around the serial number label 42, against which the reading device can be placed.

As is shown in FIG. 3, a cable interface 46 is connected at the circuit interface 36, through which a data cable carrying the vehicle dynamics data 16 can be connected to the circuit interface 36. Both interfaces 36, 46 can, according to the principle of a plug and socket, be constructed accordingly as a socket and plug.

In order to ensure that the correct cable is connected to the circuit interface 36, an appropriate serial number label 48, which identifies the circuit interface 36, can be applied to the circuit interface 36 corresponding to the serial number label 42 on the circuit housing 40. In addition, an appropriate serial number label 50, which identifies the cable interface 46, can also be applied to the cable interface 46. The information on the two above-mentioned serial number labels 48, 50 can be configured in such a way that they depend on one another for corresponding, associated interfaces 36, 46. If the cable interface 46 and the circuit interface 36 are connected together, this dependency can be checked. Alternatively or in addition, this dependency can also be used during fault-finding, in order to check whether the correct cable has been connected to the cable interface.

The circuit interface 36 can here, as illustrated in FIGS. 2 and 3, be partially enclosed by the molding compound 40. The enclosure should, however, not include the serial number label 48 of the circuit interface 36, in order not to hinder the ability to recognize the serial number label 48.

The invention claimed is:

1. An electronic device, comprising:
   an electronic circuit, housed in a circuit housing,
   a molded body formed from molding compound surrounding the circuit housing, and
   a circuit interface connected to the electronic circuit for electrical connection to a cable interface of a data line,
   wherein the molding compound has a cutout that exposes the circuit housing in which a feature that identifies the electronic circuit is arranged on the circuit housing,
   wherein the circuit interface comprises a feature that identifies the circuit interface, and
   wherein the circuit interface is partly enclosed by the molding compound in such a way that the feature that identifies the circuit interface remains exposed.

2. An electronic device, comprising:
   an electronic circuit, housed in a circuit housing,
   a molded body formed from molding compound surrounding the circuit housing, and
   a circuit interface connected to the electronic circuit for electrical connection to a cable interface of a data line,
   wherein the molding compound has a cutout that exposes the circuit housing in which a feature that identifies the electronic circuit is arranged on the circuit housing,
   wherein the circuit interface comprises a feature that identifies the circuit interface,
   wherein the feature that identifies the circuit interface depends on a feature that identifies the cable interface on the cable interface, and
   wherein the circuit interface is partly enclosed by the molding compound in such a way that the feature that identifies the circuit interface remains exposed.

* * * * *